United States Patent [19]

Sibata

[11] Patent Number: 4,690,646
[45] Date of Patent: Sep. 1, 1987

[54] IC PACKAGE CONNECTOR WITH CONTACTS OF HIGH DENSITY

[75] Inventor: Suegi Sibata, Tokyo, Japan

[73] Assignee: Yamaichi Electric Mfg. Co., Ltd., Tokyo, Japan

[21] Appl. No.: 868,047

[22] Filed: May 29, 1986

[30] Foreign Application Priority Data

May 29, 1985 [JP] Japan .............................. 60-80729[U]

[51] Int. Cl.$^4$ .......................................... H01R 23/72
[52] U.S. Cl. ...................................................... 439/71
[58] Field of Search ................... 339/17 CF; 264/299, 264/328.1

[56] References Cited

U.S. PATENT DOCUMENTS 4,166,665  9/1979  Cutchaw .................. 339/17 CF

Primary Examiner—Neil Abrams
Attorney, Agent, or Firm—Wenderoth, Lind & Ponack

[57] ABSTRACT

An IC package connector of a molded material and with closely spaced leads has a connector body, an IC package accommodation section formed in the center thereof, at least one pair of rows on opposite sides of the IC package accommodation section, each of the rows having a plurality of parallel partition walls at the same pitch and having a small thickness, a plurality of contact implanting slits defined between adjacent partition walls and having a small width, two separator walls having a thickness substantially the same as the thickness of the partition walls and disposed on the outside of the extreme end partition walls at the opposite ends of the rows and separated therefrom by a distance substantially the same as the width of the contact implanting slits, and two buffer grooves having a width substantially greater than a slit and each having one side wall formed by outside surface of the corresponding separator wall and its outer side wall formed by the inner surface of a side of the connector body, and a plurality of contacts implanted in the contact implanting slits, the presence of the buffer grooves prevents deformation of the separator walls and extreme end partition walls during molding.

1 Claim, 8 Drawing Figures

IC PACKAGE CONNECTOR WITH CONTACTS OF HIGH DENSITY

FIELD OF THE INVENTION AND RELATED ART STATEMENT

The present invention relates to a connector for an IC package having IC leads closely spaced at a small pitch.

There is an increasing tendency to make the pitch of the IC leads of an IC package smaller. In response to this tendency, connectors for an IC package are required to have contact implanting slits at a small pitch and have contacts in a high density. Recently, the demand for an IC package connector provided with a prescribed number of contact implanting slits having a width of 0.2 mm and a pitch of 0.4 mm, for example, which have to be formed in a limited space of the connector, has been widespread. In order to satisfy the recent demand, plates 18 and 19 (FIG. 6) for molding partition walls which will define contact implanting slits at a fine pitch are inevitably required to be made much smaller in thickness.

In a case where the contact implanting slits of a connector as disclosed in U.S. Pat. No. 4,560,216 have been made closer by the use of the molding plates 18 and 19, one molding plate 19 for forming, in conjunction with both the molding plate 18 having its one surface attached to the one molding plate 19 and another molding plate 19 attached to the other surface of the molding plate 18, a partition wall and a contact implanting slit which will be disposed at each of the opposite ends of a row of partition walls and contact implanting slits will receive a large side pressure when a material such as molten plastic is poured into a mold (not shown) provided with a plurality of molding plates 18 and 19, because the inside end wall of a large thickness is molded between the surface of the one molding plate 19 and the inside surface of the mold. As a result, as illustrated in FIG. 7, the surface iof the inside end wall 3 formed between the molding plate 19 and the mold, and which surface faces the front slit 2a formed at the extremity of a row of contact implanting slits 2 and partition walls 1 is deformed. That is to say, there is a fair possibility of the extreme end slit 2a and extreme end partition wall 1b being too deformed to implant a contact (not shown) therein as shown on the right side of FIG. 7 and there is also a possibility of the end partition wall 1b having a chipped portion as shown on the left side of FIG. 7. In this case, therefore, if contacts were able to be implanted in such inferior slits 2a, they would be deformed and/or, what is worse, injured by the chipped portions of the end partition walls 1b, thereby producing inferior connection between the deformed and/or injured contacts of a connector and the IC leads of an IC package.

OBJECT AND SUMMARY OF THE INVENTION

The main object of the present invention is to provide a connector having contacts implanted between partition walls which define contact implanting slits in each of a plurality of rows of partition walls and contact implanting slits closely spaced at a small pitch without forming either an inferior slit opening or a chipped partition wall at each of the opposite ends of any of the plurality of rows, and responsive to the tendency to make the pitch of IC leads of an IC package smaller.

To attain the object described above, according to the present invention, there is provided an IC package connector with contacts closely spaced at a small pitch which comprises a connector body, an IC package accommodation section formed in the center of the connector body, at least one pair of rows opposed to each other on opposite sides of the IC package accommodation section, each of the at least one pair of rows comprising a plurality of parallel partition walls at the same pitch and having a small thickness, a plurality of contact implanting slits defined between adjacent partition walls and having a small width, two separator walls having a thickness substantially the same as the thickness of the partition walls and disposed on the outside of opposite end partition walls and separated therefrom by a distance substantially the same as the width of the contact implanting slits, and two buffer grooves of a large width each having one side wall constituted by the outside surface of the corresponding one of the separator walls and its other side wall constituted by the inner surface of the corresponding inside end wall of the connector body, and a plurality of contacts implanted in the contact implanting slits.

The above and other objects, characteristic features and advantages of the present invention will become apparent to those skilled in the art as the disclosure is made in the following description of a preferred embodiment of the invention, as illustrated in the accompanying drawings.

DETAILED DESCRIPTION OF THE PREFERRED EMBODIMENT

Figure 1:
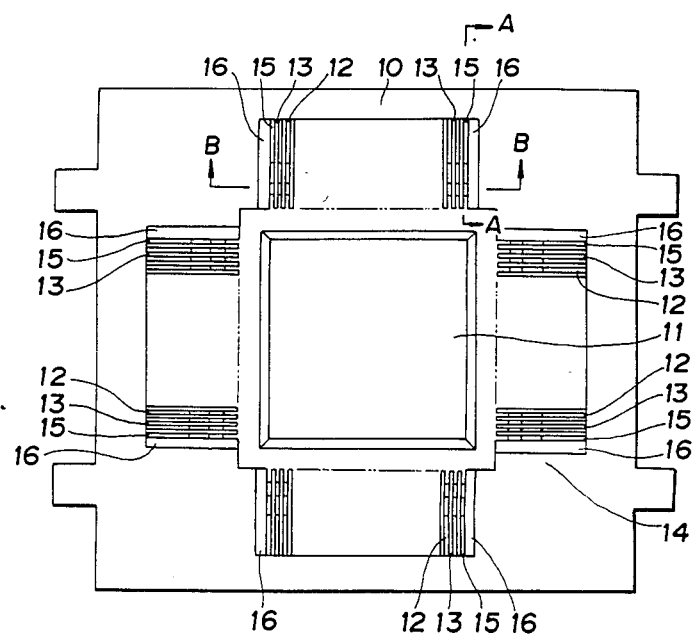
FIG. 1 is a top plan view illustrating one embodiment of the IC package connector with contacts closely spaced at a small pitch according to the present invention.
Figure 2:
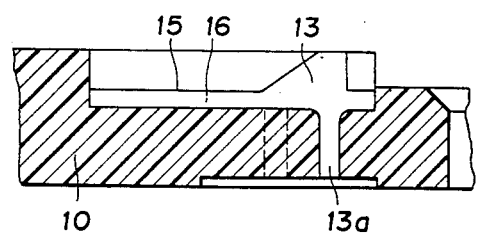
FIG. 2 is an enlarged cross section taken along line A—A in FIG. 1.
Figure 3A:
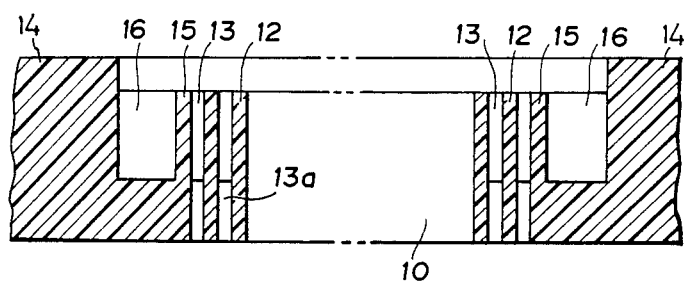
FIG. 3(A) is an enlarged cross section taken along line B—B in FIG. 1.

The present invention will now be described with reference to the illustrated embodiment. Referring to FIG. 1, a connector 10 with contacts closely spaced to a small pitch has an IC package accommodation section 11 formed in the center thereof. Around the four sides 14 of the IC package accommodation section 11 there are four rows of alternately partition walls 12 and contact implanting slits 13. The partition walls 12 of each row have the same small thickness and are aligned at the same pitch in parallel to one another to define the contact implanting slits 13 of a small width between the adjacent partition walls. Outside of each of the partition walls 12 at the opposite extremities of each row there is formed a separator wall 15 which is separated from the extreme end partition wall 12 by a distance substantially the same as the width of the contact implanting slits 13 and which preferably has the same thickness and length as the partition walls 12. The separator wall 15 is parallel to the partition walls 12 and, as illustrated in FIG. 3(A), connected at the lower end to a side 14 of the connector 10. The inner surface of the side 14 is also parallel to the separator wall 15. A buffer groove 16 of a width substantially greater than the width of a slit 13 is defined between the outside surface of the separator wall 15 and the inner surface of the side 14 of the connector 10. The length of the buffer groove 16 is substantially the same as that of the partition wall 12 and that of the separator wall 15.

Figure 6:
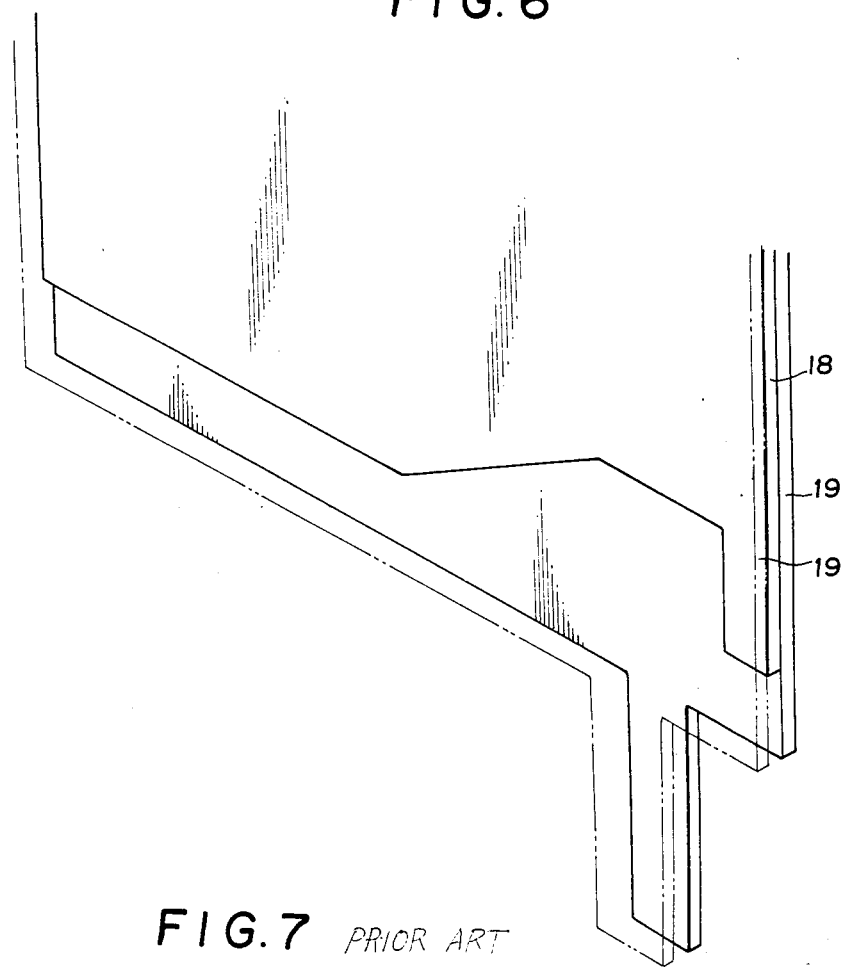
FIG. 6 is an enlarged perspective view illustrating molding plates for molding the partition walls and contact implanting slits.
Figure 7:
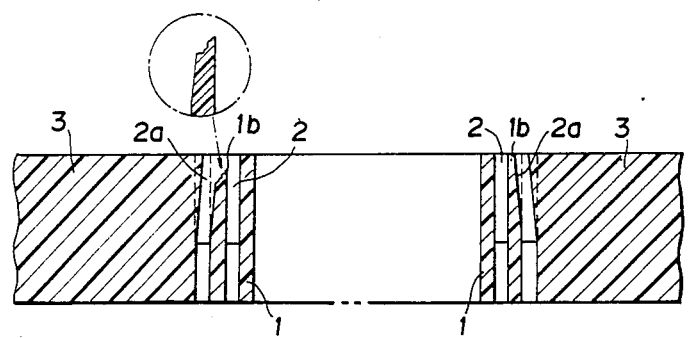
FIG. 7 is a longitudinal cross section illustrating partition walls and contact implanting slits of a conventional connector.

The connector 10 is molded from a plastic material so that the relationship among the opposite extreme end partition walls 12, the separator walls 15 and the buffer grooves 16 is fully satisfied. In molding the connector 10, since the thickness and length of the partition wall 12 are substantially the same as the separator wall 15, the pressure of a material poured to form the partition wall 12 is substantially the same as pressure of the material poured to form the separator wall and, further since large side pressure applied in forming the side 14 having a large thickness is absorbed by the part of the mold forming the buffer grooves 16, there is no fear of the extreme end partition walls 12 and end contact implanting slits being deformed and there is no fear of the extreme end partition walls 12 having chipped portions. The partition walls 12, contact implanting slits 13 and separator walls 15 are molded by the use of the molding plates 18 and 19 shown in FIG. 6.

Figure 5:
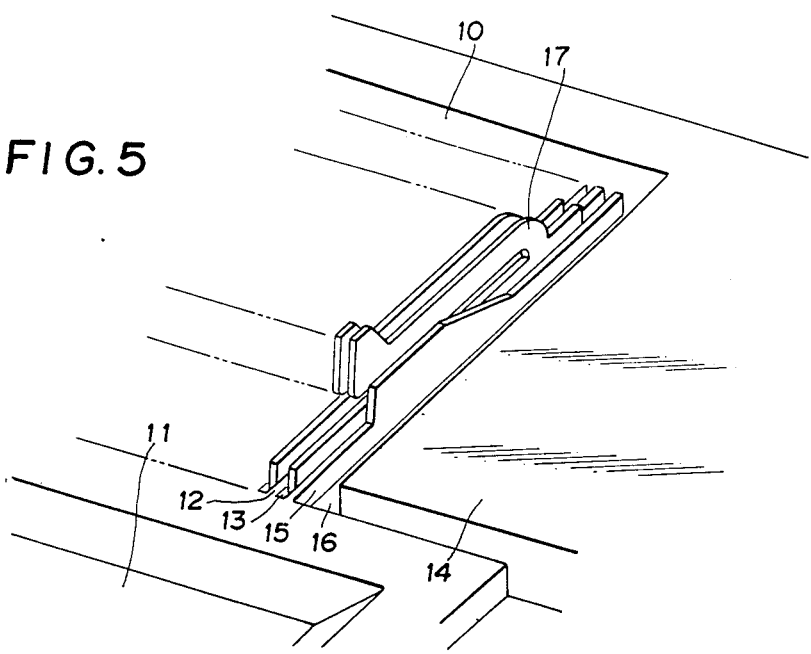
FIG. 5 is an enlarged perspective view illustrating contacts implanted in the contact implanting slits.

Each of the contact implanting slits 13 has a contact implanting hole 13a communicating therewith. Contacts 17 are implanted in the contact implanting slits 13 as shown in FIG. 5. The contact implanting slits 13 may be formed in the shape of a groove having one or two open ends or in the shape of an oblong hole having closed opposite ends, as the occasion demands.

Figure 3B:
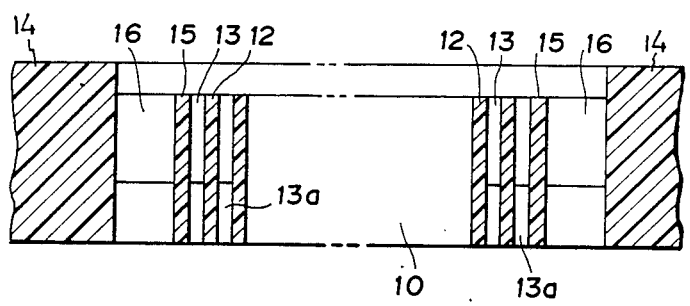
FIG. 3(B) is an enlarged cross section, similar to FIG. 3(A), illustrating a modification of the embodiment of FIG. 1.
Figure 4:
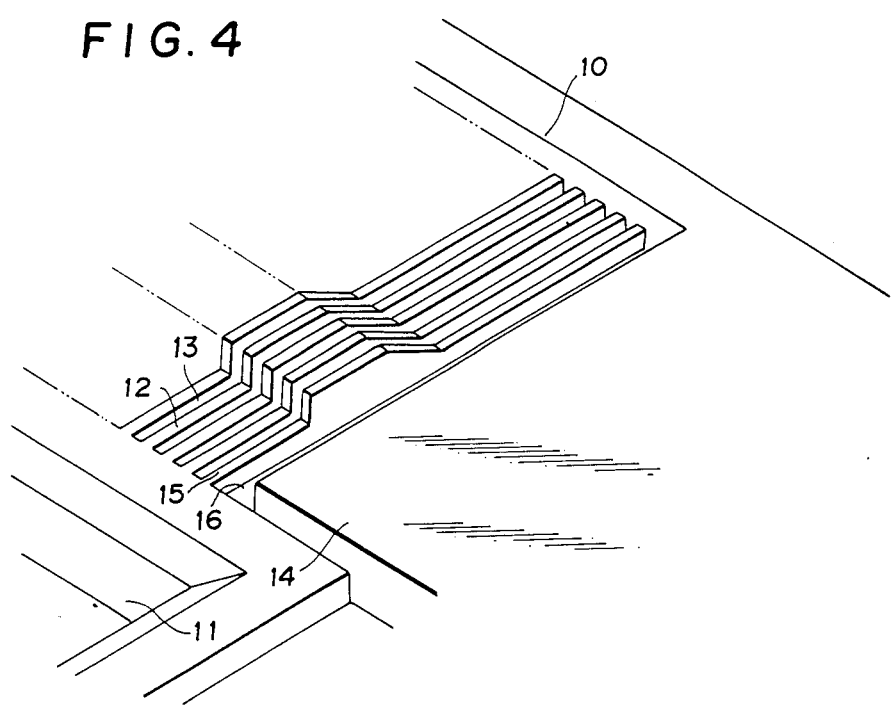
FIG. 4 is an enlarged perspective view illustrating part of partition walls and contact implanting slits of the embodiment.

Further, the buffer grooves 16 may extend partially or wholly through the side 14 as illustrated in FIG. 3(B). The number of the rows of alternating partition walls 12 and contact implanting slits 13 may be varied in accordance with the number of sides of the IC package from which IC leads project.

According to the present invention, as described above, since the connector is molded so as to have the separator walls and buffer grooves between the extreme end partition walls and the sides of the connector body, the extreme end partition walls are not affected by the large side pressure applied to the molding plates for the formation of the inside end walls and prevent the extreme end partition walls and the contact implanting slits from being deformed. Therefore, formation of chipped partition walls and inferior openings of the contact implanting slits can be prevented from occurring. Thus, deformation of the contacts to be implanted in the contact implanting slits and inferior connection between the contacts and the IC leads can be fully eliminated. Further, according to the present invention, since the partition walls and the contact implanting slits disposed at a small pitch can be precisely formed, it is possible to provide a connector effectively responsive to the recent tendency to provide closely spaced IC leads of an IC package.

What is claimed is:

1. An IC package connector having closely spaced contacts, comprising:
    a connector body;
    an IC package accommodation section formed in the center of said connector body, said body having a wall extending around said accommodation section;
    at least one pair of rows opposed to each other on opposite sides of said IC package accommodation section, each of said rows comprising a plurality of parallel partition walls at the same pitch and having a small thickness, a plurality of contact implanting slits defined between adjacent partition walls and having a small width, two separator walls having a thickness substantially the same as the thickness of said partition walls and disposed outside of the end partition walls at opposite ends of said rows and spaced from said end partition walls a distance substantially the same as the width of the contact implanting slits, and two buffer spaces having a width substantially larger than the width of one of said slits and each having one side wall constituted by the outside surface of the corresponding separator wall and the other side wall constituted by an inner surface of said wall of said connector body, at least part of said buffer spaces extending completely through the thickness of said wall of said connector body; and
    a plurality of contacts in the contact implanting slits.

* * * * *